United States Patent
Minamisawa et al.

(10) Patent No.: US 6,631,062 B1
(45) Date of Patent: Oct. 7, 2003

(54) ELECTRICALLY CONDUCTIVE CERAMIC MATERIAL, A PROCESS OF PRODUCING SAME, AND AN ELECTROSTATIC CHUCK

(75) Inventors: Kazuyoshi Minamisawa, Sendai (JP); Hiroyuki Matsuo, Sendai (JP); Sari Endoh, Miyagi (JP); Yukio Kishi, Sendai (JP); Kazunori Saitoh, Sendai (JP); Hiroshi Suzuki, Miyagi (JP); Motohiro Umezu, Higashikurume (JP); Mamoru Ishii, Tokyo (JP); Hironori Ishida, Higashikurume (JP); Youichi Shirakawa, Higashikurume (JP); Norikazu Sashida, Ichikawa (JP)

(73) Assignees: Nihon Ceratec Co., Ltd., Miyagi (JP); Taiheiyo Cement Corporation, Tokyo (JP)

( * ) Notice: Subject to any disclaimer, the term of this patent is extended or adjusted under 35 U.S.C. 154(b) by 0 days.

(21) Appl. No.: 09/455,829

(22) Filed: Dec. 6, 1999

(30) Foreign Application Priority Data

| Apr. 13, 1999 | (JP) | .......... 11-104940 |
| Sep. 28, 1999 | (JP) | .......... 11-274618 |
| Sep. 29, 1999 | (JP) | .......... 11-275951 |

(51) Int. Cl.$^7$ ................................ H01G 4/00
(52) U.S. Cl. .............. 361/58; 361/118; 361/127; 361/311; 361/323
(58) Field of Search ............. 361/234, 58, 118, 361/127, 311, 323

(56) References Cited

U.S. PATENT DOCUMENTS

| 4,887,186 A | * | 12/1989 | Takeda et al. ........... 361/321.4 |
| 5,933,318 A | * | 8/1999 | Tomono et al. ........... 361/323 |
| 6,103,385 A | * | 8/2000 | Sasaki ..................... 428/469 |

FOREIGN PATENT DOCUMENTS

| JP | 63-141205 A | 6/1988 | ........ C04B/35/00 |
| JP | 4-296040 A | 10/1992 | ........ H01L/21/68 |
| JP | 5-330911 A | 12/1993 | ........ C04B/35/50 |
| JP | 9-199578 A | 7/1997 | ........ H01L/21/68 |
| JP | 10-45461 A | 2/1998 | ........ C04B/35/58 |
| JP | 11-240751 A | 9/1999 | ........ B23Q/3/15 |

OTHER PUBLICATIONS

Y.A. Boratov et al, Electrophysical and Magnetic Characteristic of Samples of the System $Ln_2O_3$–$Ti_2O_3$ (Ln=La, Nd, Gd, Er, Lu, Y), *The Journal of Inorganic Chemistry*, vol. 39, No. 3, pp. 491–493 (1994).

* cited by examiner

*Primary Examiner*—Stephen W. Jackson
(74) *Attorney, Agent, or Firm*—Frishauf, Holtz, Goodman & Chick, P.C.

(57) ABSTRACT

An electrically conductive ceramics comprises a compound containing at least one element belonging to the Group 3A of the periodic table and $TiO_{2-x}$ (0<x<2) in a range such that the $TiO_{2-x}$ (0<x<2) accounts for 1 to 60 wt % of the total amount of the ceramics, and at least part of the compound and the $TiO_{2-x}$ form a composite oxide.

30 Claims, 1 Drawing Sheet

ELECTRICALLY CONDUCTIVE CERAMIC MATERIAL, A PROCESS OF PRODUCING SAME, AND AN ELECTROSTATIC CHUCK

BACKGROUND OF THE INVENTION

The present invention relates to an electrically conductive ceramics suited for use in electrodes, heaters, semiconductor-related parts such as ionizers, wafer transporting hands, chamber domes, clamp rings, and other parts of a semiconductor manufacturing machine, and to a process of producing such a ceramics. More particularly, the invention relates to an electrically conductive ceramics suitable for use in parts of a plasma etching apparatus, for example, which is used in a severe environment such as a plasma environment or a high-temperature oxidizing atmosphere, a process of producing such a ceramics, and an electrostatic chuck using the conductive ceramics as a dielectric layer thereof.

Conventional conductive ceramics include those which consist of a single substance showing electrical conductivity, such as SiC, TiN, TiC, WC, $WO_2$, and $TiO_{2-x}$ (0<x<2) (titania with oxygen deficiency). Composite ceramics, such as $Al_2O_3$—SiC, $Al_2O_3$—$TiO_{2-x}$ (0<x<2), AlN—TiN(TiC) and $Si_3N_4$—TiC(TiN), are also available which are each a mixture of an insulating ceramics and a conductive ceramics and of which the mixing ratio of the ceramics can be varied to change the electrical conductivity.

Where electrically conductive ceramics are used in the applications mentioned above, their electrical conductivity should desirably be changed to meet the purpose. However, in the case of ceramics which consist of a single substance showing electrical conductivity, among those mentioned above, it is difficult to control the electrical conductivity.

On the other hand, in the case of composite ceramics obtained by mixing an insulating ceramics with a conductive ceramics, the electrical conductivity can be changed by varying the proportion of the conductive ceramics. However, the electrical conductivity shows a steep change and thus is subject to variations, making it difficult to control the electrical conductivity to a desired value. Especially in cases where a composite ceramics is used for a long time in a severe environment as mentioned above, an additional problem arises in that the electrical conductivity gradually varies.

Meanwhile, an electrostatic chuck is used in a semiconductor manufacturing machine etc. as a jig for fixing, straightening, or transporting silicon wafers or the like. The electrostatic chuck has a dielectric layer provided on its electrode and is constructed such that, when a voltage is applied to the electrode, the dielectric layer electrostatically attracts a wafer thereon.

As the dielectric layer of such an electrostatic chuck, alumina, sapphire, etc. having an electrical conductivity of $10^{-15}$ S/cm or less are conventionally used. However, where a material with high insulation quality, such as alumina, is used as the dielectric layer of an electrostatic chuck, attraction is achieved by means of an electrostatic attractive force (Coulomb force) produced between the electrode and the electric charge induced in an object to be attracted. Accordingly, to obtain large attractive force, the thickness of the dielectric layer must be reduced to 0.1 mm or less, which, however, increases the possibility of the dielectric layer being broken during machining.

Attempts have therefore been made to obtain large attractive force without the need to form a thin dielectric layer, more specifically, to enhance the electrostatic attractive force by admixing a dielectric material such as alumina with the aforementioned conductive ceramics to increase the electrical conductivity of the dielectric layer (Up to $10^{-8}$ to $10^{-14}$ S/cm) and thereby permit movement of the electric charge. Namely, by thus increasing the electrical conductivity of the dielectric layer, it is possible to induce electric charge at the surface of the dielectric material, and since electrostatic force acts with respect to the electric charge induced in an object to be attracted, large electrostatic attractive force (Johnson-Rahbeck force) can be obtained without the need to form a thin dielectric layer.

However, the electrostatic chuck having a dielectric layer admixed with the conventional conductive ceramics is associated with the problem that if the chuck is used under severe conditions such as in a plasma environment, the electrical conductivity is liable to change, making the attractive force unstable.

This inconvenience can be mitigated to some extent by using a dielectric layer in which alumina is admixed with titania to make the titania deficient in oxygen and thereby increase the electrical conductivity. However, if an electrostatic chuck having such a dielectric layer is used in a plasma gas containing oxygen, the surface of the dielectric layer is oxidized, and since the electrical conductivity of the dielectric layer lowers, the attractive force of the electrostatic chuck decreases and also the attraction and release of a wafer slow down.

BRIEF SUMMARY OF THE INVENTION

The present invention was created in view of the above circumstances, and an object thereof is to provide an electrically conductive ceramics whose electrical conductivity can be varied over a wide range and yet is reduced in variations, and a process of producing such a ceramics.

Another object of the present invention is to provide an electrically conductive ceramics which shows small change in electrical conductivity even in a severe atmosphere such as in a plasma environment or high-temperature oxidizing atmosphere and which can therefore be used stably, and a process of producing such a ceramics.

Still another object of the present invention is to provide an electrostatic chuck which shows small change in electrical conductivity and thus can produce large electrostatic attractive force even when used under severe conditions such as in a plasma environment.

Further object of the present invention is to provide an electrostatic chuck which shows small change in electrical conductivity and thus can produce large electrostatic attractive force even when used under severe conditions such as in a plasma environment containing oxygen.

According to a first aspect of the present invention, there is provided an electrically conductive ceramics comprising a compound containing at least one element belonging to the Group 3A of the periodic table, and $TiO_{2-x}$ (0<x<2), in a range such that the $TiO_{2-x}$ (0<x<2) accounts for 1 to 60 wt % of a total amount of the ceramics wherein at least part of the compound and the $TiO_{2-x}$ form a composite oxide.

According to a second aspect of the present invention, there is provided an electrically conductive ceramics comprising a compound containing at least one element belonging to the Group 3A of the periodic table, and $TiO_{2-x}$ (0<x<2), in a range such that the $TiO_{2-x}$ (0<x<2) accounts for 1 to 42 wt % of a total amount of the ceramics wherein at least part of the compound and the $TiO_{2-x}$ form a composite oxide.

According to a third aspect of the present invention, there is provided a process of producing an electrically conductive ceramics comprising the steps of: admixing powder of a compound containing at least one element belonging to the Group 3A of the periodic table, with powder of $TiO_2$ or of a composite oxide consisting essentially of $TiO_2$ and a compound containing at least one element belonging to the Group 3A of the periodic table, in a ratio such that the $TiO_2$ accounts for 1 to 60 wt % of a total amount of the powder mixture; forming the powder mixture to obtain a formed body; sintering the formed article to obtain a sinterd body; and heating the sinterd body in an inert gas or in a reducing atmosphere at a temperature of 1300 to 1700° C. with a surface of the sinterd body kept in contact with a substance containing carbon as a main component.

According to a fourth aspect of the present invention, there is provided an electrostatic chuck having an electrode and a dielectric layer formed on the electrode, for electrostatically attracting an object on the dielectric layer when voltage is applied to the electrode, wherein the dielectric layer is formed of a ceramics which comprising an oxide containing at least one element belonging to the Group 3A of the periodic table and $TiO_{2-x}$ ($0<x<2$) and in which at least part of the oxide and the $TiO_{2-x}$ form a composite oxide, and the dielectric layer has an electrical conductivity of $10^{-8}$ to $10^{-14}$ S/cm.

According to a fifth aspect of the present invention, there is provided an electrostatic chuck having an electrode and a dielectric layer formed on the electrode, for electrostatically attracting an object on the dielectric layer when voltage is applied to the electrode, wherein the dielectric layer is formed of a ceramics which has electrical conductivity and which contains, as main components, an oxide containing an element belonging to the Group 3A of the periodic table and a composite oxide having oxygen deficiency and containing Ti and an element belonging to the Group 3A of the periodic table, and the electrical conductivity of the ceramics is $10^{-8}$ to $10^{-14}$ S/cm.

According to a sixth aspect of the present invention, there is provided an electrostatic chuck having an electrode and a dielectric layer formed on the electrode, for electrostatically attracting an object on the dielectric layer when voltage is applied to the electrode, wherein the dielectric layer is made of a ceramics which has electrical conductivity and which contains, as main components, an oxide containing an element belonging to the Group 3A of the periodic table and a composite oxide having oxygen deficiency and containing Ti and an element belonging to the Group 3A of the periodic table, and the dielectric layer is obtained by the step of admixing powder of a compound of an element belonging to the Group 3A of the periodic table, with powder of a Ti compound or of a composite oxide containing Ti and an element belonging to the Group 3A of the periodic table, to obtain a powder mixture, the step of forming the powder mixture to obtain a formed body, the step of sintering the formed body in the air to obtain a sinterd body, and the step of heat-treating the sinterd body in a reducing atmosphere such that the dielectric layer obtained has an electrical conductivity of $10^{-8}$ to $10^{-14}$ S/cm.

According to a seventh aspect of the present invention, there is provided an electrostatic chuck having an electrode and a dielectric layer formed on the electrode, for electrostatically attracting an object on the dielectric layer when voltage is applied to the electrode, wherein the dielectric layer is made of a ceramics which has electrical conductivity and which contains, as main components, an oxide containing an element belonging to the Group 3A of the periodic table and a composite oxide having oxygen deficiency and containing Ti and an element belonging to the Group 3A of the periodic table, and the dielectric layer is obtained by the step of admixing powder of a compound of an element belonging to the Group 3A of the periodic table, with powder of a Ti compound or of a composite oxide containing Ti and an element belonging to the Group 3A of the periodic table, to obtain a powder mixture, the step of forming the powder mixture to obtain a formed body, the step of sintering and simultaneously heat-treating the formed body in a reducing atmosphere, such that the dielectric layer obtained has an electrical conductivity of $10^{-8}$ to $10^{-14}$ S/cm.

The present invention was created based on the below-mentioned findings of the inventors hereof.

(1) By admixing a compound containing at least one element belonging to the Group 3A of the periodic table with $TiO_{2-x}$ ($0<x<2$) and making at least part of the compound and the $TiO_{2-x}$ form a composite oxide, it is possible to obtain an electrically conductive ceramics of which the electrical conductivity can be varied over a wide range and yet is reduced in variations.

(2) By suitably controlling the content of $TiO_{2-x}$ ($0<x<2$), it is possible to obtain an electrically conductive ceramics which shows small change in electrical conductivity even in a severe atmosphere and thus can be stably used.

(3) By using such an electrically conductive ceramics as a dielectric layer and suitably controlling its electrical conductivity, it is possible to provide an electrostatic chuck of which the electrical conductivity of the dielectric layer undergoes little change even when used in a plasma environment, especially in a plasma gas containing oxygen, and which can stably produce large electrostatic attractive force by means of Johnson-Rahbeck force.

DETAILED DESCRIPTION OF THE INVENTION

The present invention will be hereinafter described in detail.

An electrically conductive ceramics according to the present invention contains a compound containing at least one element selected from the Group 3A of the periodic table and $TiO_{2-x}$ ($0<x<2$) in such a range that the $TiO_{2-x}$ ($0<x<2$) accounts for 1 to 60 wt % of the total amount of the ceramics, and at least part of the compound and the $TiO_{2-x}$ form a composite oxide.

The compound containing at least one element selected from the Group 3A of the periodic table may be $Y_2O_3$, $La_2O_3$, $Yb_2O_3$, $Sc_2O_3$, $Nd_2O_3$, $Er_2O3$, $Sm_2O_3$, $Eu_2O_3$, etc., for example.

Compounds of Y, La and Yb among the elements belonging to the Group 3A of the periodic table, for example, $Y_2O_3$, $La_2O_3$ and $Yb_2O_3$ form, together with Ti, composite oxides such as $Y_2TiO_{5-x}$ ($0<x<5$), $Y_2Ti_2O_{7-x}$ ($0<x<7$), $La_2TiO_{5-x}$ ($0<x<5$), $La_2Ti_2O_{7-x}$ ($0<x<7$), $La_4Ti_9O_{24-x}$ ($0<x<24$), $Yb_2TiO_{5-x}$ ($0<x<5$), $Yb_2Ti_2O_{7-x}$ ($0<x<7$), and etc. and are preferred because the electrical conductivity is stabilized by the composite oxide. Among these, compounds of Y are especially preferred because of ease of formation. Specifically, $Y_2TiO_{5-x}$ (0<x<5), $Y_2Ti_2O_{7-x}$ (0<x<7), and etc. can be easily obtained by combining $Y_2O_3$, which is a compound of Y, with $TiO_{2-x}$ (0<x<2).

In the present invention, it is essential that the compound containing at least one element selected from the Group 3A of the periodic table and $TiO_{2-x}$ (0<x<2) should form a composite oxide; however, not all of the compound and $TiO_{2-x}$ need to form a composite oxide and such a composite oxide may be formed by at least part of the compound and $TiO_{2-x}$. Preferably, however, $TiO_{2-x}$ (0<x<2) present in the form of single substance should be small in proportion.

The content of $TiO_{2-x}$ (0<x<2) is set to 1 to 60 wt % of the total amount of the ceramic. If the content is smaller than 1 wt %, the resulting ceramic does not show electrical conductivity and it is also difficult to form a composite oxide. On the other hand, if the content exceeds 60 wt %, the amount of $TiO_{2-x}$ which is present in the form of single substance without reacting with $Y_2O_3$ or the like increases, so that the electrical conductivity is liable to become unstable in a severe environment.

A preferable range of the content of $TiO_{2-x}$ (0<x<2) is 1 to 42 wt %, more preferably 1 to 6 wt %. By setting the content of $TiO_{2-x}$ (0<x<2) to fall within the preferred range, it is possible to minimize change of the electrical conductivity when the ceramics is exposed to a plasma gas atmosphere containing oxygen, mentioned later, in a heated ambient air atmosphere, or in an oxygen-enriched atmosphere.

The electrical conductivity of the conductive ceramics according to the present invention can be varied within a range of $10^3$ to $10^{-14}$ S/cm, by suitably selecting the kind and proportion of the compound of an element belonging to the Group 3A of the periodic table. Where the content of $TiO_{2-x}$ (0<x<2) falls within the preferred range of 1 to 42 wt %, the electrical conductivity can be varied within a range of $10^{-3}$ to $10^{-14}$ S/cm, and where the content is within the still preferred range of 1 to 6 wt %, the electrical conductivity can be varied within a range of $10^{-8}$ to $10^{-14}$ S/cm.

The conductive ceramics of the present invention should desirably have as high relative density as possible, preferably 98% or higher. If the relative density is smaller than 98%, the number of pores is so large that the electrical conductivity is subject to variations.

The conductive ceramics according to the present invention can provide remarkable effects when used in a plasma gas containing oxygen, in a heated ambient air atmosphere, or in an oxygen-enriched atmosphere. The reason is as follows. If ordinary conductive ceramics, of which the electrical conductivity is imparted by oxygen deficiency, are exposed for a long time to a plasma gas containing oxygen, a heated ambient air atmosphere or an oxygen-enriched atmosphere, they are oxidized by oxygen contained in the atmosphere, with the result that the electrical conductivity lowers. According to the present invention, by contrast, reduction in the electrical conductivity can be minimized, and thus the conductive ceramic of the invention is very suited for use in a plasma gas containing oxygen, a heated ambient air atmosphere or an oxygen-enriched atmosphere. In the present invention, the smaller the content of $TiO_{2-x}$ (0<x<2), the less $TiO_{2-x}$ exists in the form of single substance, and the larger extent to which the oxidation is suppressed, providing a greater effect of suppressing reduction in the electrical conductivity. Taking these into account, the content of $TiO_{2-x}$ (0<x<2) is set to fall within the preferred range 1 to 42 wt %, more preferably 1 to 6 wt %, as mentioned above.

The content of oxygen in oxygen plasma is preferably 10 vol % or more, more preferably 40 vol % or more. In ordinary conductive ceramics whose electrical conductivity is imparted by oxygen deficiency, the electrical conductivity lowers if the oxygen content of the plasma is 10 vol % or more, and greatly drops if the oxygen content is 40 vol % or more. Even under such conditions, reduction in electrical conductivity of the conductive ceramic according to the present invention can be minimized.

The temperature of the heated ambient air atmosphere or oxygen-enriched atmosphere is preferably 400° C. or higher, more preferably 600° C. or higher. In ordinary conductive ceramics of which the electrical conductivity is imparted by oxygen deficiency, the electrical conductivity lowers if the temperature of such an atmosphere is 400° C. or higher, and greatly drops if the temperature is 600° C. or higher. Even under such conditions, reduction in electrical conductivity of the conductive ceramic according to the present invention can be minimized.

A process of producing the electrically conductive ceramics according to the present invention will be now described.

The conductive ceramics of the present invention can be obtained by mixing powder of a compound containing at least one element belonging to the Group 3A of the periodic table with powder of $TiO_2$ or of a composite oxide consisting of $TiO_2$ and a compound containing at least one element belonging to the Group 3A of the periodic table in a ratio such that the $TiO_2$ accounts for 1 to 60 wt % of the total amount of the powder mixture, forming and then sintering the powder mixture. Subsequently, the sinterd body is heated at a temperature of 1300 to 1700° C. in an inert gas or in a reducing atmosphere with the surface thereof kept in contact with a substance containing carbon as its major component.

The production process will be now explained in more detail.

Powders to be used as the material of the conductive ceramics of the present invention should preferably have a purity of 98% or more, still preferably 99.% or more. If the purity is lower than 98%, the electrical conductivity is subject to variations. The particle size of the powders should preferably be 5 µm or less, more preferably 3 µm or less. If the particle size is larger than 5 µm, the driving force of the sintering lowers, making it difficult to obtain a densely sinterd body.

The starting material may be prepared by conventional procedure. Such conventional procedure includes, for example, a method of adding an organic solvent such as alcohol or water to the powders mixed in a predetermined ratio and mixing the admixture in a ball mill or the like, followed by drying, and a method of separating a coprecipitate from a solution having a predetermined proportion of salt, alkoxide or the like.

To further the denseness of the sinterd body with ease, the mixture as the material may be admixed with a sintering additive such as $SiO_2$ or MgO. There is no particular restriction on the form of the sintering additive to be added, and the additive may be in any desired form such as oxide powder, salt, alkoxide, etc.

The powder mixture obtained in this manner is formed into a predetermined shape by single-axis pressing or cold isostatic pressing (CIP), and is then sintered at 1300 to 1700° C. in an ambient air atmosphere under the atmospheric pressure. Subsequently, with the surface of the sinterd ceramic body kept in contact with a substance containing carbon as its main component, the sinterd body is reduced in an inert gas or in a reducing atmosphere at 1300 to 1700° C.

By thus making the sinterd body in contact with a substance containing carbon as a major component, it is possible to obtain the effect of restraining the electrical conductivity from varying within the article as well as among articles. The substance containing carbon as its main component may be carbon black or graphite, and may be in the form of powder, paste, or sheet, for example.

The time for the sintering and the reducing process is not particularly limited and may be two to four hours. If the sintering temperature is lower than 1300° C., sufficient denseness is not obtained and the electrical conductivity is subject to variations; on the other hand, if the sintering temperature is higher than 1700° C., decomposition is liable to occur. Also, if the reducing temperature is lower than 1300° C., the reducing power lowers and the reduction does not proceed sufficiently; on the other hand, if the reducing temperature is higher than 1700° C., decomposition is liable to occur.

The electrically conductive ceramic according to the present invention can be produced following a different procedure from that described above, for example, the sinterd body may be subjected to hot isostatic pressing (HIP) under a pressure of 1000 kgf/cm$^2$ or more in an inert gas or in a reducing atmosphere at 1300 to 1700° C. However, by employing the above-described process, it is possible to ensure stable manufacture of electrically conductive ceramics having a desired electrical conductivity.

As mentioned above, the electrical conductivity of the ceramics according to the present invention can be varied over a wide range and yet is reduced in variations. Also, the electrical conductive ceramics of the present invention shows small change in electrical conductivity even when used in a severe environment such as a plasma environment or a high-temperature oxidizing atmosphere and thus can be used stably for a long time. Consequently, the electrically conductive ceramics according to the present invention is suited for use in electrodes, heaters, semiconductor-related parts such as ionizers, wafer transporting hands, chamber domes, clamp rings, and other parts of a semiconductor manufacturing machine, and is especially suitable for use in parts of machines for performing processing in a severe environment, such as a plasma etching apparatus.

An electrostatic chuck according to the present invention will be now described.

Figure 1:
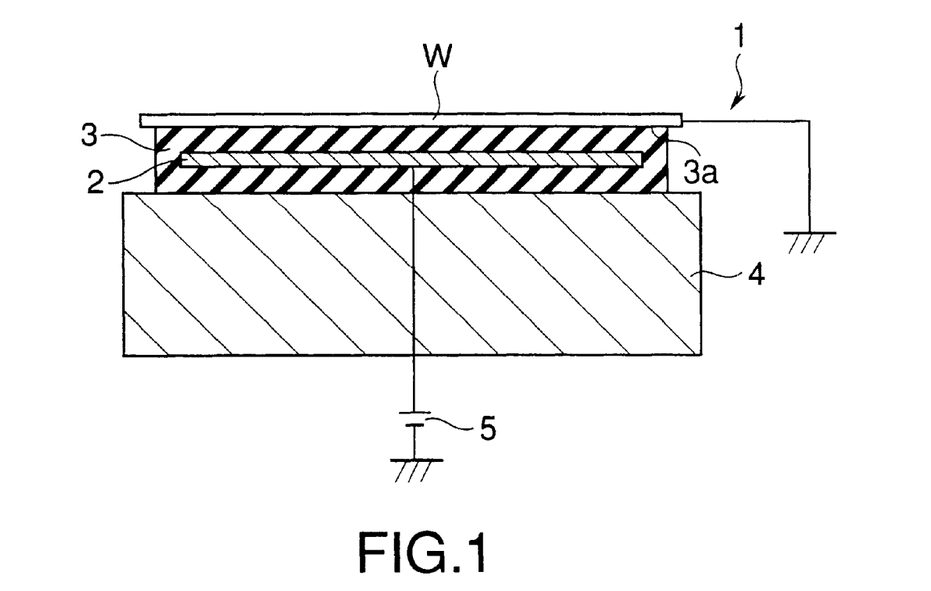
FIG. 1 is a sectional view of a single-electrode type electrostatic chuck to which the present invention is applied.
Figure 2:
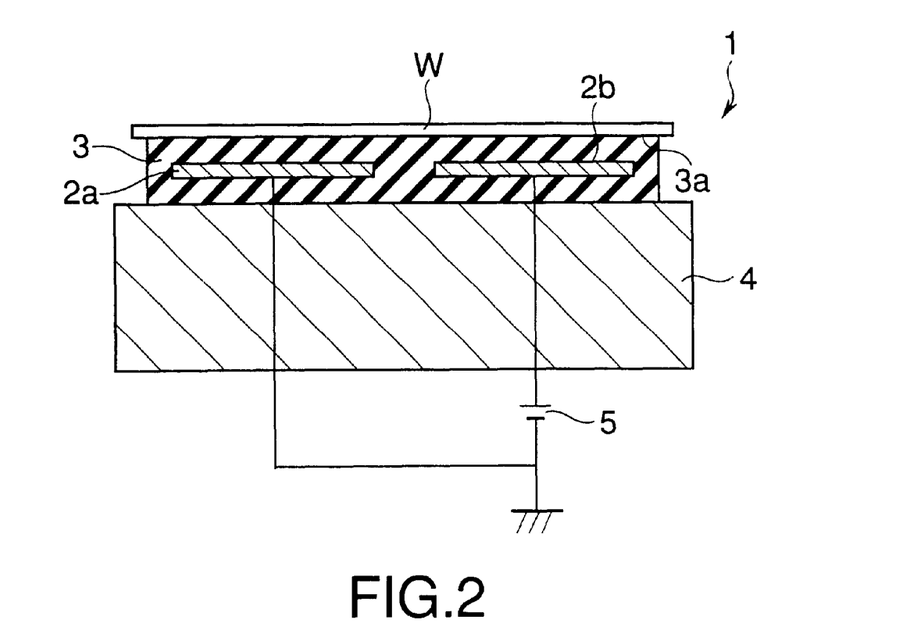
FIG. 2 is a sectional view of a double-electrode type electrostatic chuck to which the present invention is applied.

FIGS. 1 and 2 are sectional views each illustrating an example of an electrostatic chuck to which the present invention is applied, wherein FIG. 1 shows a single-electrode type and FIG. 2 shows a double-electrode type.

The single-electrode type electrostatic chuck 1 shown in FIG. 1 includes an electrode 2 interposed between upper and lower dielectric layers 3 and is fixed on a base 4. The electrode 2 is connected to a direct-current power supply 5, and when current is supplied to the electrode 2 from the power supply 5, a semiconductor wafer W, which is an object to be attracted and placed on an attraction surface 3$a$ of the upper dielectric layer 3, is electrostatically attracted.

The double-electrode type electrostatic chuck 1' shown in FIG. 2 includes a pair of electrodes 2$a$ and 2$b$ interposed between upper and lower dielectric layers 3 and connected to a power supply 5. Charges of opposite polarities are supplied to these electrodes from the power supply 5, whereupon a semiconductor wafer W placed on an attraction surface 3$a$ of the upper dielectric layer 3 is electrostatically attracted.

The dielectric layers 3 are formed of the aforementioned electrically conductive ceramics of the present invention, that is, a ceramics which contains an oxide containing at least one element belonging to the Group 3A of the periodic table and TiO$_{2-x}$ (0<x<2) and in which at least part of the oxide and TiO$_{2-x}$ form a composite oxide. It is not necessary that all of the TiO$_{2-x}$ (0<x<2) and the oxide containing at least one element belonging to the Group 3A of the periodic table should form such a composite oxide, but it is preferable that the TiO$_{2-x}$ (0<x<2) should not be present in the form of single substance. Namely, the ceramics used should preferably contain, as its major components, an oxide containing an element belonging to the Group 3A of the periodic table and a composite oxide having oxygen deficiency and containing an element belonging to the Group 3A of the periodic table and Ti, and have electrical conductivity. Examples of the elements belonging to the Group 3A of the periodic table and of the composite oxides are given above.

As the elements belonging to the Group 3A of the periodic table, at least one selected from Y, La, Yb and Dy is preferably used as mentioned above, and among these elements, Y is especially preferred. Y readily forms, with Ti, a composite oxide having oxygen deficiency, and permits the formation of a composite oxide which is stable especially in a plasma gas containing oxygen and which has oxygen deficiency with Ti replaced by Y$_2$O$_3$.

The dielectric layers 3 are made using such a material because the material shows small change in electrical conductivity and provides stable electrostatic attractive force even when used under severe conditions such as in a plasma environment, as mentioned above. Especially, since a composite oxide having oxygen deficiency and containing an element belonging to the Group 3A of the periodic table and Ti is scarcely oxidized even in a plasma gas containing oxygen, the dielectric layers 3 containing such a composite oxide also show little change in electrical conductivity even in a plasma gas containing oxygen and thus can provide stable electrostatic attractive force.

The electrical conductivity of the dielectric layers 3 is so set as to fall within a range of 10$^{-8}$ to 10$^{-14}$ S/cm. With the electrical conductivity set within this range, it is possible to obtain large attractive force without adversely affecting circuits formed on the semiconductor wafer. Namely, if the electrical conductivity is higher than 10$^{-8}$ S/cm, large leak current flows in the attracted wafer, possibly destroying circuits formed on the wafer. On the other hand, if the electrical conductivity is smaller than 10$^{-14}$ S/cm, little charge is induced at the surface of the dielectric layer and Johnson-Rahbeck force does not act effectively, making it impossible to obtain large electrostatic attractive force. The electrical conductivity of the dielectric layers 3 can be controlled by controlling the Ti content or the production process to thereby vary the amount of the composite oxide having oxygen deficiency, the value of oxygen deficiency, etc.

The Ti content in terms of TiO$_2$ (TiO$_{2-x}$ (0<x<2)) is preferably 1 to 15 wt %, more preferably 2 to 6 wt %, of the total amount of the ceramics. If the Ti content is smaller than 1 wt %, difficulty arises in increasing the electrical conductivity of the dielectric layer to 10$^{14}$ S/cm or higher, though it depends on the production process employed. If the Ti content is larger than 15 wt %, it is difficult to keep the electrical conductivity of the dielectric layer at 10$^{-8}$ S/cm or lower. By setting the Ti content to 2 to 6 wt %, it is possible to control with ease the electrical conductivity to fall within the range 10$^{-8}$ to 10$^{-14}$ S/cm. Where the Ti content is higher than 6 wt %, a composite oxide, such as Y$_2$TiO$_5$, having oxygen deficiency and susceptible to oxidation in a plasma gas containing oxygen increases, and the electrical conductivity of the dielectric layer tends to show large change in a plasma gas containing oxygen. Accordingly, especially in cases where the dielectric layer is used in a plasma gas containing oxygen, the Ti content in terms of $TiO_2$ is preferably set to 2 to 6 wt %.

In the case of the conventionally used dielectric layer containing alumina admixed with titania, its electrical conductivity readily changes due to oxidation in a plasma gas containing 10 vol % or more of oxygen. In the dielectric layer according to the present invention, by contrast, the electrical conductivity shows almost no change even if the plasma gas contains 50 vol % or more of oxygen, whereby the dielectric layer can be stably used for an electrostatic chuck.

With the electrostatic chuck constructed in this manner, large electrostatic attractive force, can be produced by means of Johnson-Rahbeck force when voltage is applied to the electrode to attract an object on the dielectric layer. Further, the electrical conductivity scarcely changes even under severe conditions such as in a plasma environment, especially a plasma environment containing oxygen, whereby the chuck can maintain stable attractive force.

A preferred process of producing the electrostatic chuck according to be present invention will be now described.

The starting material for the dielectric layer may be prepared following a conventional procedure. For example, a mixture of powders of predetermined ratio, as the starting material, may be admixed with organic solvent such as alcohol or water, mixed in a ball mill, and then dried. Alternatively, coprecipitate may be separated from a solution having a predetermined proportion of salt, alkoxide or the like. The mixture as the material may be admixed with a sintering additive such as $SiO_2$ or MgO so that it can be made denser with ease in a later stage. The form of the sintering additive to be admixed is not particularly limited and may be oxide powder, salt, alkoxide, etc.

The powder mixture obtained in this manner is formed into a predetermined shape by single-axis pressing or cold isostatic pressing (CIP), and then sintered at 1500 to 1700° C. in an oxidizing atmosphere. If, in this case, the sintering temperature is lower than 1500° C., sufficient denseness is not obtained; if 1700° C. is exceeded, decomposition possibly takes place.

Subsequently, the thus-sinterd body is reduced at 1500 to 1700° C. in a reducing atmosphere. If the reducing temperature is lower than 1500° C., the reduction does not progress satisfactorily, making the electrical conductivity unstable. On the other hand, if the reducing temperature is higher than 1700° C., a disadvantage arises in that decomposition possibly takes place. The time for the sintering and for the reduction is not particularly limited, and about two to four hours suffice. Alternatively, the formed body may be sintered and at the same time heat-treated at 1500 to 1700° C. in a reducing atmosphere. The process described above provides a material for dielectric layers which has an electrical conductivity of $10^{-8}$ to $10^{-14}$ S/cm and which shows stable electrical conductivity even in a plasma gas containing oxygen.

The ceramics obtained in this manner is subjected to suitable machining as needed, to form a dielectric layer with a desired shape.

The dielectric layer for the electrostatic chuck according to the present invention may be produced following a process different from the above-described one. For example, the sintering temperature may be in the range of 1100 to 1900° C., and also the reducing temperature may be in the range of 1100 to 1900° C.; however, the above-described process is preferred because it permits stable production of dielectric layers having a desired electrical conductivity. With the process described above, dielectric layers can be obtained which have the Ti content of 2 to 6 wt % in terms of $TiO_2$ and an electrical conductivity of approximately $10^{-8}$ to $10^{-14}$ S/cm.

The electrostatic chuck is not particularly limited in its structure, and may have various other structures than those shown in FIGS. 1 and 2 in which the electrode is arranged within the dielectric layer, for example, a structure in which a dielectric layer having an electrode formed on one side thereof is affixed by adhesive to a ceramic plate or an Al base plate. The electrode structure is also not particularly limited and may be of single- or double-electrode type as mentioned above, and the shape of the electrode is also not particularly limited.

The present invention can be modified in various other ways without departing from the spirit and scope thereof.

EXAMPLES

Examples 1 to 10

Each of powder mixtures shown in Table 1 below, that is, a total of 200 g of each mixture consisting of powder of a compound of an element belonging to the Group 3A of the periodic table, which powder had a purity of 98% or more and an average particle size of 3 μm, and powder of $TiO_2$, $Y_2TiO_5$ or $Y_2Ti_2O_7$ having a purity of 98% or more and an average particle size of 2 μm, 200 g of water which had been subjected to ion-exchange treatment, and 1 wt % of optional $SiO_2$ or MgO as the sintering additive were put into a polyethylene pot together with a total of 250 g of nylon balls having a diameter φ of 10 mm and having an iron core therein, and the components were mixed for 16 hours. The obtained slurry was dried under reduced pressure in a rotary evaporator, and the powder obtained was passed through a #100 nylon mesh. The resulting powder was molded to a thickness of 6 mm under the pressure of 10 kgf/cm², using a mold of 50 mm in diameter φ, and was further subjected to cold isostatic pressing under a pressure of 1200 kgf/cm², thereby obtaining a formed body. The formed bodies obtained in this manner were sintered for three hours at respective temperatures shown in Table 1. The resulting sinterd bodies were then treated in a reducing atmosphere for two hours at respective predetermined temperatures after being applied with carbon paste on the surface thereof. With respect to the sinterd bodies treated in this manner, the relative density was measured.

Also, after the surface of each sinterd body was ground, the electrical conductivity was measured.

(1) In addition, using a parallel plate type plasma etching apparatus, plasma containing oxygen ($O_2$) (oxygen concentration: 50 vol %) was produced with radio-frequency electric power of 1000 W supplied, and after each sinterd body was left in the plasma for 100 hours, its electrical conductivity was measured.

(2) Also, using a high-temperature ambient air furnace, each sinterd body was left in the furnace at 600° C. in an ambient air atmosphere for 100 hours, and then the electrical conductivity was measured.

The results are shown in Table 1.

TABLE 1

| | Insulating ceramic | Conductive ceramic | Content of conductive ceramic* (wt %) | Sintering temp. (° C.) | Reducing temp. (° C.) | Range of electrical conductivity** (S/cm) | | |
|---|---|---|---|---|---|---|---|---|
| | | | | | | before treatment | after $O_2$ plasma treatment | after heating in ambient air atmosphere |
| Ex. 1 | $Y_2O_3$ | $TiO_2$ | 6 | 1700 | 1700 | $4.3 \times 10^{-8}$ ~ $6.6 \times 10^{-8}$ | $3.6 \times 10^{-8}$ ~ $5.7 \times 10^{-8}$ | $3.8 \times 10^{-8}$ ~ $6.0 \times 10^{-8}$ |
| Ex. 2 | $Y_2O_3$ | $TiO_2$ | 6 | 1700 | 1700 (1500 kgf/cm²) | $3.8 \times 10^{-8}$ ~ $5.9 \times 10^{-8}$ | $1.1 \times 10^{-8}$ ~ $3.0 \times 10^{-8}$ | $1.1 \times 10^{-8}$ ~ $3.3 \times 10^{-8}$ |
| Ex. 3 | $Y_2O_3$ | $TiO_2$ | 6*** | 1700 | 1350 | $3.0 \times 10^{-9}$ ~ $5.3 \times 10^{-9}$ | $2.6 \times 10^{-9}$ ~ $5.0 \times 10^{-9}$ | $2.9 \times 10^{-9}$ ~ $5.4 \times 10^{-9}$ |
| Ex. 4 | $Y_2O_3$ | $TiO_2$ | 60 | 1700 | 1350 | $8.3 \times 10^{2}$ ~ $9.3 \times 10^{2}$ | $7.3 \times 10^{0}$ ~ $8.8 \times 10^{0}$ | $1.2 \times 10^{1}$ ~ $3.0 \times 10^{1}$ |
| Ex. 5 | $Y_2O_3$ | $TiO_2$ | 42 | 1700 | 1350 | $2.2 \times 10^{-3}$ ~ $4.4 \times 10^{-3}$ | $1.1 \times 10^{-3}$ ~ $3.7 \times 10^{-3}$ | $1.4 \times 10^{-3}$ ~ $3.5 \times 10^{-3}$ |
| Ex. 6 | $Y_2O_3$ | $TiO_2$ | 1 | 1600 | 1500 (1800 kgf/cm²) | $1.0 \times 10^{-14}$ ~ $2.9 \times 10^{-14}$ | $9.9 \times 10^{-13}$ ~ $2.0 \times 10^{-14}$ | $9.6 \times 10^{-13}$ ~ $1.5 \times 10^{-14}$ |
| Ex. 7 | $Y_2O_3$ | $TiO_2$ | 3 | 1500 | 1400 (2000 kgf/cm²) | $2.9 \times 10^{-10}$ ~ $4.7 \times 10^{-10}$ | $2.6 \times 10^{-10}$ ~ $4.6 \times 10^{-10}$ | $2.7 \times 10^{-10}$ ~ $4.3 \times 10^{-10}$ |
| Ex. 8 | $Y_2O_3$ | $Y_2Ti_2O_7$ | 5 | 1650 | 1600 (2000 kgf/cm²) | $1.9 \times 10^{-9}$ ~ $3.2 \times 10^{-9}$ | $1.7 \times 10^{-9}$ ~ $3.1 \times 10^{-9}$ | $1.8 \times 10^{-9}$ ~ $2.9 \times 10^{-9}$ |
| Ex. 9 | $La_2O_3$ | $TiO_2$ | 4 | 1600 | 1600 (2000 kgf/cm²) | $3.3 \times 10^{-10}$ ~ $6.7 \times 10^{-10}$ | $2.2 \times 10^{-10}$ ~ $4.9 \times 10^{-10}$ | $2.3 \times 10^{-10}$ ~ $5.2 \times 10^{-10}$ |
| Ex. 10 | $Yb_2O_3$ | $Y_2Ti_2O_3$ | 2 | 1650 | 1700 (2000 kgf/cm²) | $1.2 \times 10^{-13}$ ~ $2.9 \times 10^{-13}$ | $1.0 \times 10^{-13}$ ~ $3.0 \times 10^{-13}$ | $1.1 \times 10^{-13}$ ~ $2.9 \times 10^{-13}$ |

*For compounds containing $TiO_2$, the content is expressed in terms of $TiO_2$.
**Measured with respect to 20 samples.
***1 wt % $SiO_2$ added.

As seen from Table 1, the examples of the present invention having their composition falling within the prescribed range show small variations in electrical conductivity before and after the treatment, and it was confirmed that the examples showed very small change in electrical conductivity even in the severe environment as described above.

Comparative Examples 1 to 6

Comparative examples having their composition falling outside the prescribed range were prepared following the same procedure as that employed in the above examples, and the relative density, the electrical conductivity before and after the plasma treatment, and the electrical conductivity before and after the heat treatment in the ambient air atmosphere were measured. The results are shown in Table 2 below.

TABLE 2

| | Insulating ceramic | Conductive ceramic | Content of conductive ceramic* (wt %) | Sintering temp. (° C.) | Reducing temp. (° C.) | Range of electrical conductivity** (S/cm) | | |
|---|---|---|---|---|---|---|---|---|
| | | | | | | before treatment | after $O_2$ plasma treatment | after heating in ambient air atmosphere |
| Comp. Ex. 1 | $Y_2O_3$ | $TiO_2$ | 90 | 1650 | 1600 (1700 kgf/cm²) | $8.3 \times 10^{3}$ ~ $7.5 \times 10^{3}$ | $3.8 \times 10^{-1}$ ~ $4.7 \times 10^{-2}$ | $2.0 \times 10^{-1}$ ~ $2.2 \times 10^{-2}$ |
| Comp. Ex. 2 | $Y_2O_3$ | $TiO_2$ | 80*** | 1700 | 1600 | $9.9 \times 10^{3}$ ~ $1.2 \times 10^{2}$ | $1.0 \times 10^{-1}$ ~ $4.0 \times 10^{-2}$ | $9.8 \times 10^{0}$ ~ $9.7 \times 10^{-1}$ |
| Comp. Ex. 3 | — | $TiO_2$ | 100 | 1350 | 1300 (2000 kgf/cm²) | $7.5 \times 10^{4}$ ~ $9.8 \times 10^{3}$ | $1.1 \times 10^{-3}$ ~ $9.7 \times 10^{-5}$ | $5.6 \times 10^{-3}$ ~ $8.7 \times 10^{-4}$ |
| Comp. Ex. 4 | $Al_2O_3$ | $TiO_2$ | 25 | 1650 | 1700 (2000 kgf/cm²) | $6.5 \times 10^{-6}$ ~ $3.3 \times 10^{-9}$ | $1.6 \times 10^{0}$ ~ $6.3 \times 10^{-4}$ | $2.6 \times 10^{-1}$ ~ $1.7 \times 10^{-3}$ |
| Comp. Ex. 5 | $Si_3N_4$ | $TiO_2$ | 60 | — | 1800 | $4.3 \times 10^{-1}$ ~ $1.3 \times 10^{-4}$ | $1.6 \times 10^{-5}$ ~ $3.8 \times 10^{-8}$ | $6.8 \times 10^{-4}$ ~ $7.7 \times 10^{-7}$ |
| Comp. Ex. 6 | AlN | $TiO_2$ | 75 | — | 1700 | $5.5 \times 10^{3}$ ~ $4.9 \times 10^{-1}$ | $7.3 \times 10^{-6}$ ~ $2.8 \times 10^{-9}$ | $1.5 \times 10^{-5}$ ~ $6.7 \times 10^{-8}$ |

*For compounds containing $TiO_2$, the content is expressed in terms of $TiO_2$.
**Measured with respect to 20 samples.
***1 wt % MgO added.

As seen from Table 2, it was confirmed that, in the case of the comparative examples having their composition falling outside the prescribed range, the electrical conductivity showed a large change after the plasma treatment and after the heat treatment in the ambient air atmosphere under the atmospheric pressure. Also, Comparative Examples 4 to 6 using the conventional materials showed large variations in electrical conductivity among samples before the treatment.

Examples 11 to 14, Comparative Examples 7

Examples of electrostatic chuck will be now described.

Powder of $Y_2O_3$, as an oxide containing an element belonging to the Group 3A of the periodic table, and powder of $TiO_2$, as an oxide containing Ti, were mixed in weight ratios of $Y_2O_3$ to $TiO_2$ of 98:2, 96:4, and 94:6 (Examples 11 to 13). Also, as comparative examples, $Y_2O_3$ powder and $TiO_2$ powder were mixed in weight ratios of $Y_2O_3$ to $TiO_2$ of 100:0, and 92:8 (Comparative Examples 7 and 8). The powders used had a purity of 99% or more and a particle size of 3 μm or less.

Subsequently, each powder mixture was molded into a shape of 250 mm in diameter φ and 6 mm in thickness t, and after each formed body was sintered in the air at 1600° C., it was reduced in Ar at 1600° C. The thus-sinterd body was machined into a shape of 200 mm in diameter φ and 2 mm in thickness t, thereby obtaining a dielectric layer.

Then, a double electrode was formed on one surface of each dielectric layer by copper plating, and the other surface (attraction surface) of the dielectric layer was ground to obtain a surface roughness Ra of 0.3 μm. The dielectric layer was affixed, at its surface on which the double electrode had been formed, to an anodized surface of an Al base by adhesive, thereby completing the formation of an electrostatic chuck. The electrical conductivity of each dielectric layer was measured by a three-terminal method. Table 3 below shows the compositions, Ti contents and electrical conductivities of the dielectric layers of the electrostatic chucks (Examples 11–14 and Comparative Examples 7) produced in the aforementioned manner.

Examples 14 to 16

For Examples 14 to 16, powders of $La_2O_3$, $Y_2O_3$ and $Dy_2O_3$ were respectively used as an oxide of an element belonging to the Group 3A of the periodic table, and were individually mixed with $TiO_2$ powder in a weight ratio of 95:5. Each powder mixture was formed into a shape of 250 mm in diameter φ and 6 mm in thickness t, like Examples 11 to 14, and was sintered and at the same time reduced in Ar at 1600° C. The sinterd body thus obtained was machined into a shape of 200 mm in diameter φ and 2 mm in thickness t, thereby obtaining a dielectric layer. Subsequently, as in the above-described case, a double electrode was formed on one surface of each dielectric layer by copper plating, and the other surface (attraction surface) of the dielectric layer was ground to obtain a surface roughness Ra of 0.3 μm. The dielectric layer was affixed, at its surface on which the double electrode had been formed, to an anodized surface of an Al base by adhesive, thereby completing the formation of an electrostatic chuck. Table 3 also shows the compositions, Ti contents and electrical conductivities of the dielectric layers of the electrostatic chucks (Examples 14 to 16) produced in this manner.

Comparative Example 9

For Comparative Example 9, a mixture of alumina with titania (1.5 wt % titania) was used to obtain a dielectric layer. The dielectric layer had an electrical conductivity of $4.5 \times 10^{-13}$ S/cm.

TABLE 3

| | Group 3A element | Ti content (in terms of $TiO_2$) (wt %) | Electrical conductivity (S/cm) |
| --- | --- | --- | --- |
| Example 11 | $Y_2O_3$ | 2 | $1.8 \times 10^{-14}$ |
| Example 12 | $Y_2O_3$ | 4 | $1.1 \times 10^{-10}$ |
| Example 13 | $Y_2O_3$ | 6 | $4.8 \times 10^{-9}$ |
| Example 14 | $La_2O_3$ | 5 | $4.2 \times 10^{-9}$ |
| Example 15 | $Y_2O_3$ | 5 | $7.7 \times 10^{-10}$ |
| Example 16 | $Dy_2O_3$ | 5 | $1.3 \times 10^{-9}$ |
| Comp. Ex. 7 | $Y_2O_3$ | 0 | $6.7 \times 10^{-17}$ |
| Comp. Ex. 8 | $Y_2O_3$ | 8 | $1.9 \times 10^{-8}$ |

(Evaluation of Electrostatic Chucks)

Each of the thus-obtained electrostatic chucks was set in a plasma etching apparatus, and by causing a silicon wafer to be electrostatically attracted to the electrostatic chuck under plasma conditions stated below, the electrostatic attractive force and wafer releasing characteristic before and after the plasma treatment were evaluated, and also the electrical conductivity of the dielectric layer before and after the plasma treatment was measured. The results are shown in Table 4 below.

Plasma Conditions

Plasma gas: $O_2$ (50 vol %)+$CF_4$

Gas flow rate: 200 SCCM

RF frequency: 13.56 MHz

RF power: 2 W/cm$^2$

Time: 100 hours

The electrostatic attractive force was evaluated by causing a silicon wafer to be attracted to the electrostatic chuck with voltages of ±1 kV applied thereto, pulling the wafer upward, and measuring the force applied when the wafer was separated from the chuck. Change of electrostatic attractive force due to plasma treatment, shown in the table, is expressed as a ratio of the electrostatic attractive force after the plasma treatment to that before the plasma treatment.

The wafer releasing characteristic was evaluated in terms of residual attractive force/electrostatic attractive force, by causing a wafer to be attracted to the electrostatic chuck with voltages of ±1 kV applied thereto, then reducing the applied voltages to 0 kV, and measuring a residual attractive force upon lapse of one minute. Change of wafer releasing characteristic due to plasma treatment, shown in the table, is expressed as a ratio of the wafer releasing characteristic after the plasma treatment to that before the plasma treatment.

TABLE 4

| | Change of electrostatic attractive force | Change of releasing characteristic | Change of electrical conductivity (S/cm) before treatment | Change of electrical conductivity (S/cm) after treatment | Remarks |
|---|---|---|---|---|---|
| Example 11 | 1.2 | 1.5 | $1.8 \times 10^{-14}$ | $1.6 \times 10^{-14}$ | |
| Example 12 | 1.1 | 0.9 | $1.1 \times 10^{-10}$ | $9.1 \times 10^{-11}$ | |
| Example 13 | 0.9 | 2.0 | $4.8 \times 10^{-9}$ | $1.0 \times 10^{-8}$ | |
| Example 14 | 1.3 | 1.7 | $4.2 \times 10^{-9}$ | $1.9 \times 10^{-9}$ | |
| Example 15 | 0.8 | 2.1 | $7.7 \times 10^{-10}$ | $1.1 \times 10^{-9}$ | |
| Example 16 | 0.9 | 1.5 | $1.3 \times 10^{-9}$ | $1.2 \times 10^{-9}$ | |
| Comp. Ex. 7 | — | — | $6.7 \times 10^{-17}$ | $5.0 \times 10^{-17}$ | failed to attract wafer |
| Comp. Ex. 8 | 0.4 | 12.1 | $1.9 \times 10^{-8}$ | $1.6 \times 10^{-13}$ | |
| Comp. Ex. 9 | 0.5 | 8.5 | $4.5 \times 10^{-13}$ | $2.2 \times 10^{-15}$ | |

As seen from Table 4, Examples 11 to 16 showed small change in the electrical conductivity before and after the plasma treatment, and also no large change was observed in respect of the electrostatic attractive force and the wafer releasing characteristic. By contrast, Comparative Examples 8 and 9 showed large change in the electrical conductivity before and after the plasma treatment, the electrostatic attractive force reduced to ½ or less, and the wafer releasing characteristic showed an increase by eight times or more. Reduction in the electrostatic attractive force is caused presumably because the surface of the dielectric layer was oxidized due to the plasma treatment and thus a low-conductivity thin film was formed on the surface of the dielectric layer, with the result that little charge is induced at the surface of the dielectric layer. Also, the wafer releasing characteristic lowered presumably because such a low-conductivity thin film formed on the surface of the dielectric layer prevented elimination of the charge induced in the wafer and thus residual attractive force was produced. In Comparative Example 7, the electrostatic chuck failed to attract a silicon wafer. This is presumably because, in Comparative Example 7, the dielectric layer had an electrical conductivity smaller than $10^{-14}$ S/cm and thus no electrostatic attractive force (Johnson-Rahbeck force) could be produced.

What is claimed is:

1. An electrically conductive ceramics comprising a compound containing at least one element belonging to the Group 3A of the periodic table, and $TiO_{2-x}$ (0<x<2), in a range such that the $TiO_{2-x}$ (0<x<2) accounts for 1 to 60 wt % of a total amount of the ceramics, wherein at least part of the compound and the $TiO_{2-x}$ form a composite oxide.

2. The electrically conductive ceramics according to claim 1, wherein the ceramics has an electrical conductivity of $10^3$ to $10^{-14}$ S/cm.

3. The electrically conductive ceramics according to claim 1, wherein the element belonging to the Group 3A of the periodic table comprises at least one of Y, La and Yb.

4. The electrically conductive ceramics according to claim 3, wherein the element belonging to the Group 3A of the periodic table is Y.

5. The electrically conductive ceramics according to claim 4, wherein the compound containing at least one element belonging to the Group 3A of the periodic table is $Y_2O_3$.

6. The electrically conductive ceramics according to claim 1, wherein the ceramics has a relative density of 98% or more.

7. The electrically conductive ceramics according to claim 1, wherein the ceramics is used in a plasma gas containing oxygen.

8. The electrically conductive ceramics according to claim 7, wherein the plasma gas has an oxygen concentration of 10 vol % or more.

9. The electrically conductive ceramics according to claim 8, wherein the oxygen concentration of the plasma gas is 40 vol % or more.

10. The electrically conductive ceramics according to claim 1, wherein the ceramics is used in a heated ambient air atmosphere or in an oxygen-enriched atmosphere.

11. The electrically conductive ceramics according to claim 10, wherein the heated ambient air atmosphere or the oxygen-enriched atmosphere has a temperature of 400° C. or higher.

12. The electrically conductive ceramics according to claim 11, wherein the temperature of the heated ambient air atmosphere or the oxygen-enriched atmosphere is 600° C. or higher.

13. An electrically conductive ceramics comprising a compound containing at least one element belonging to the Group 3A of the periodic table, and $TiO_{2-x}$ (0<x<2), in a range such that the $TiO_{2-x}$ (0<x<2) accounts for 1 to 42 wt % of a total amount of the ceramics, wherein at least part of the compound and the $TiO_{2-x}$ form a composite oxide.

14. The electrically conductive ceramics according to claim 13, wherein the ceramics has an electrical conductivity of $10^{-3}$ to $10^{-14}$ S/cm.

15. The electrically conductive ceramics according to claim 13, wherein the $TiO_{2-x}$ (0<x<2) accounts for 1 to 6 wt % of the total amount of the ceramics.

16. The electrically conductive ceramics according to claim 15, wherein the ceramics has an electrical conductivity of $10^{-8}$ to $10^{-14}$ S/cm.

17. The electrically conductive ceramics according to claim 13, wherein the element belonging to the Group 3A of the periodic table comprises at least one of Y, La and Yb.

18. The electrically conductive ceramics according to claim 17, wherein the element belonging to the Group 3A of the periodic table is Y.

19. The electrically conductive ceramics according to claim 18, wherein the compound containing at least one element belonging to the Group 3A of the periodic table is $Y_2O_3$.

20. The electrically conductive ceramics according to claim 13, wherein the ceramics has a relative density of 98% or more.

21. The electrically conductive ceramics according to claim 13, wherein the ceramics is used in a plasma gas containing oxygen.

22. The electrically conductive ceramics according to claim 21, wherein the plasma gas has an oxygen concentration of 10 vol % or more.

23. The electrically conductive ceramics according to claim 22, wherein the oxygen concentration of the plasma gas is 40 vol % or more.

24. The electrically conductive ceramics according to claim 13, wherein the ceramics is used in a heated ambient air atmosphere or in an oxygen-enriched atmosphere.

25. The electrically conductive ceramics according to claim 24, wherein the heated ambient air atmosphere or the oxygen-enriched atmosphere has a temperature of 400° C. or higher.

26. The electrically conductive ceramics according to claim 25, wherein the temperature of the heated ambient air atmosphere or the oxygen-enriched atmosphere is 600° C. or higher.

27. A process of producing an electrically conductive ceramics, comprising the steps of:

admixing powder of a compound containing at least one element belonging to the Group 3A of the periodic table, with powder of $TiO_2$ or of a composite oxide consisting essentially of $TiO_2$ and a compound containing at least one element belonging to the Group 3A of the periodic table, in a ratio such that the $TiO_2$ accounts for 1 to 60 wt % of a total amount of the powder mixture;

forming the powder mixture to obtain a formed body;

sintering the formed body to obtain a sinterd body; and heat-treating the sinterd body in an inert gas or in a reducing atmosphere at a temperature of 1300 to 1700° C. with a surface of the sinterd body kept in contact with a substance containing carbon as a main component.

28. The process according to claim 27, wherein the element belonging to the Group 3A of the periodic table comprises at least one of Y, La and Yb.

29. The process according to claim 28, wherein the element belonging to the Group 3A of the periodic table is Y.

30. The process according to claim 29, wherein the compound containing at least one element belonging to the Group 3A of the periodic table is $Y_2O_3$.

* * * * *